United States Patent [19]

Miller

[11] Patent Number: 4,530,139
[45] Date of Patent: Jul. 23, 1985

[54] METHOD OF CONTOURING CRYSTAL PLATES

[75] Inventor: Anton J. Miller, Allentown, Pa.

[73] Assignee: AT&T Bell Laboratories, Murray Hill, N.J.

[21] Appl. No.: 535,029

[22] Filed: Sep. 23, 1983

[51] Int. Cl.³ ............................................. H04R 17/00
[52] U.S. Cl. ............................... 29/25.35; 51/216 LP; 51/284 R; 310/312
[58] Field of Search ..................... 29/25.35; 310/312; 51/165 R, 216 LP, 217 L, 284 R, 124 L

[56] References Cited

U.S. PATENT DOCUMENTS

| | | | |
|---|---|---|---|
| 2,340,843 | 2/1944 | Bailey | 51/165 R |
| 3,453,783 | 7/1969 | Queen | 51/216 LP |
| 4,221,083 | 9/1980 | Carroll | 51/216 LP |
| 4,239,567 | 12/1980 | Winings | 51/216 LP |
| 4,411,731 | 10/1983 | Miller | 156/630 |

Primary Examiner—Howard N. Goldberg
Assistant Examiner—P. W. Echols
Attorney, Agent, or Firm—Lester H. Birnbaum

[57] ABSTRACT

A method for batch-contouring crystal plates for frequency adjustment is disclosed. A plurality of plates is secured to a compliant sheet and the sheet is attached to an applicator surface which includes a resilient pad. The plates are then abraded against another surface to produce contours on all the plates. The resilient pad provides spring loading to insure uniform pressure on all the plates.

7 Claims, 2 Drawing Figures

METHOD OF CONTOURING CRYSTAL PLATES

BACKGROUND OF THE INVENTION

This invention relates to the fabrication of piezoelectric devices which include crystal plates, and in particular to a method of contouring the crystal plates.

Piezoelectric devices, such as resonators and filters, rely on the frequency response of a crystal plate, which is typically quartz, to an electric bias supplied by means of electrodes formed on the surfaces of the plates. In many applications, it is desirable to contour the edges or major faces of the plates after defining the plate dimensions in order to achieve optimum frequency control. The need is especially acute for small plates, such as those used in oscillators and clocks for microprocessors, since it is difficult to otherwise confine vibration under the electrodes.

At the present time, contouring is usually done mechanically by either optical lens-type machining (e.g., grinding, lapping or polishing) of individual plates or by "pipe-contouring" where several plates are inserted, together with an abrasive, in a rotating pipe. The lens-type machining is precise but also very costly since each plate must be individually contoured. Pipe-contouring provides a batch-contouring process, but is not precise and is not particularly suited for contouring small and thin plates (diameters less than approximately 0.3 inches).

Recently, a batch-contouring method has been proposed which involves chemical etching of plates provided in a stack. (See U.S. patent application of A. J. Miller, Ser. No. 453,348, filed Dec. 27, 1982 and assigned to the present assignee, now U.S. Pat. No. 4,411,731, which is incorporated by reference herein.) This method appears most advantageous for contouring plates intended for operation above approximately 5 MHz (thicknesses typically below 0.012 inches). It would be desirable to provide an alternative batch-contouring method which is easily adapted for fabricating lower frequency devices which generally require a steeper contour.

It is, therefore, a primary object of the invention to provide a precision method of batch-contouring crystal plates.

SUMMARY OF THE INVENTION

This and other objects are achieved in accordance with the invention, which is a method of fabricating piezoelectric devices which include crystal plates. The method comprises the steps of attaching a plurality of crystal plates to a compliant sheet, securing the sheet to an applicator which includes a resilient pad formed on the surface, and abrading the plates against another surface by means of the applicator to remove at least a portion of one of the major surfaces of each plate.

BRIEF DESCRIPTION OF THE DRAWING

These and other features of the invention are delineated in detail in the following description. In the drawing.

It will be appreciated that for purposes of illustration these figures are not necessarily drawn to scale.

DETAILED DESCRIPTION

In a typical sequence of forming plates from a quartz crystal block, the block is cut into sections and then sawed into wafers of the desired crystal orientation. Wafers are then machined into blanks of the approximate desired size and thickness, and a number of blanks is stacked so they can be machined into plates of the approximate desired lateral dimensions (diameter or length and width). The plates are then unstacked, lapped to the desired thickness and are ready for contouring in accordance with the invention.

Figure 1:
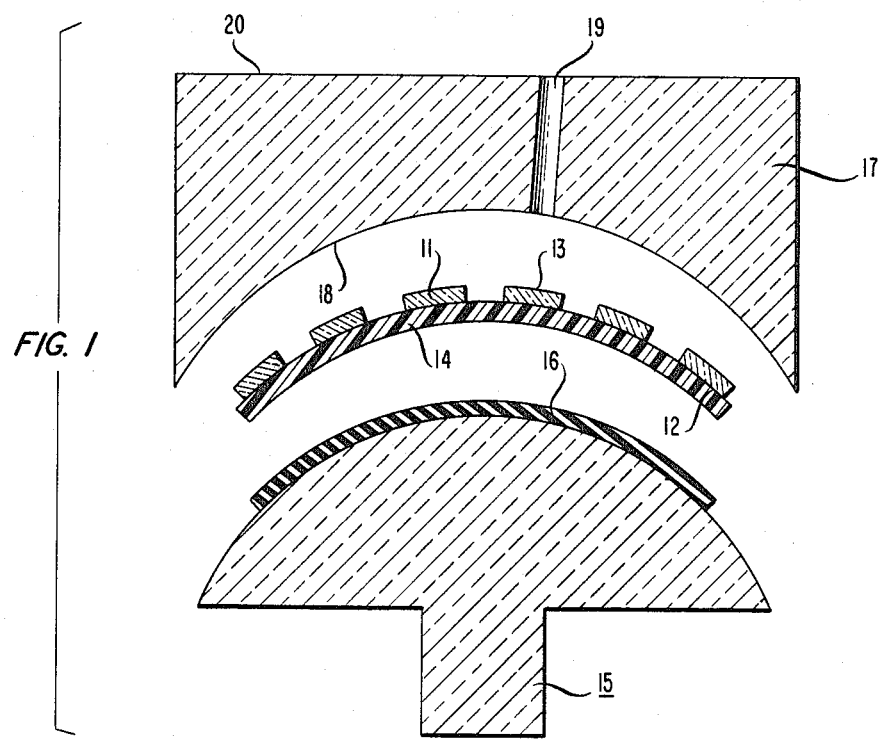
FIG. 1 is a cross-sectional schematic view of apparatus which may be utilized to practice the invention in accordance with one embodiment of the invention.

As illustrated schematically in FIG. 1, an array of crystal plates, 11, as loaded onto a compliant sheet, 14, so that one major surface, 12, of each plate is in intimate contact with the sheet and the opposite major surface, 13, of each plate can be contoured. In a typical example, the array would comprise approximately 100 plates. While in this example the plates are circular, they may also be rectangular, square or any odd shape within reasonable size limits. The plates in this example were AT-cut plates with a diameter of 0.340 inches and a thickness of 0.017 inch.

The complaint sheet in this example was a flexible polyvinyl chloride (PVC) tape with a sticky surface to which the plates adhered. The tape was edge supported by two retaining rings (not shown in FIG. 1). The thickness of the tape was approximately 0.003 inch. Other materials may be used as long as they are compliant and the plates can be secured to one surface.

The tape was then molded to the shape of the applicator, 15, which is utilized in the contouring operation. The molding operation was performed by stretching the tape over an applicator of the proper radius of curvature (which may or may not be the same applicator as shown in FIG. 1). Because the applicator is heated for the molding operation, the tape softens, stretches and molds into the shape of the applicator. A typical molding operation would be performed at approximately 80° C. for a period of time of 10 to 20 seconds. One of the advantages of this molding operation is the fact that the plates, which might be touching when first loaded onto the tape, will be separated during this step. This separation is desirable to prevent damage to the periphery of the plates during contouring.

After cooling to room temperature, the molded tape was then attached to the applicator, 15, making use of the natural adhesion between the two matching, nonslip surfaces provided by the tape, 14, and a resilient pad, 16, included on the surface of the applicator. In addition to providing a textured, nonslip surface, this pad also produces a spring loading effect during the contouring operation which insures that all plates will be uniformly contoured.

In this example, the pad was made of closed cell silicone foam rubber which is sold by CHR under the designation COHRLastic R-10470. However, the pad may comprise any resilient material which has a density providing an appropriate springiness for this application. If, for example, the density is too high, there may not be a significant spring loading effect, while if it is too low, the bond between crystals and the sheet and the flow of the abrasive may be adversely affected. A preferred density for the material in this example appears to be 0.020–0.030 pounds per cu inch, but densities outside this range may be utilized. It is also desirable for the pad to have a high compression set, which is the ability to return to its original position after the removal of a compressive load. A typical compression set in this example was 60%, i.e., the pad returns to at least 60% of its original thickness when compressed to 50% of its original thickness for 22 hours at 75° F.

The pad was applied to the applicator by means of a thin epoxy bond, or by means of an acrylic adhesive layer which is typically included on one surface of the pad. The thickness of the pad in this example was approximately ⅛ inch and, generally, thicknesses will be in the range 1/32-¼ inches for plate sizes used in this example. Pad thicknesses outside this range may be chosen for particular needs.

The applicator with the plates secured thereto was then inserted in a lapping tool, 17, with a lapping surface, 18, having the spherical shape of the desired radius of curvature. The surface in this example had a radius of curvature of 2.8 inches, but, of course, this curvature can be varied according to specific needs. In general, radii of curvature in the range 1.5-20 inches are useful for contouring. It will also be appreciated that the radius of curvature of the applicator surface including the resilient pad closely matched that of the lapping tool surface. A standard abrasive, in this example aluminum oxide powder mixed with water to form a slurry with a 35 μm grain size, was also applied to the grinding surface.

Pressure was then applied to the lapping tool and a swivel and rotary motion effected while the abrasive was introduced through hole 19 so that the surfaces, 13, of the plates secured to the applicator, 15, (which was also rotated) were abraded against the surface, 18, of the lapping tool, 17. Typically, a pressure of approximately 15-20 psi was applied for a period of time of approximately 5 minutes. For about the initial 90% of the total contouring time an abrasive grain size of 35 μm was used, and a 20 μm abrasive grain size was used for the final 10% of the time. In general, the abrasive grain size is determined by the relative amount of material to be removed during contouring. For instance, finer abrasives may be used for shallower contours. While in the example a "loose" abrasive slurry was applied, it may also be appropriate to use a tool, 17, where the surface, 18, is prepared with "fixed" abrasive particles such as, for instance, a layer of diamond particles attached to the surface, 18. At the end of the contouring operation, the tape, 14, was removed from the applicator and the plates, 11, were simply lifted off the tape.

Figure 2:
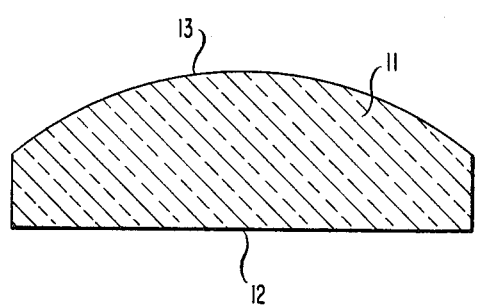
FIG. 2 is a cross-sectional view of a crystal plate which has been contoured on one major surface in accordance with the same embodiment of the invention.

A typical plate as it appears subsequent to the contouring process described above is illustrated in FIG. 2. All crystals should have a convex surface, 13, with the same radius of curvature as the tool, 17, to produce the concentric, planoconvex shape shown. In this particular example, a "full" contouring was carried out so that lapping continued until the entire surface, 13, had been contoured to some degree. To identify when contouring was completed, the surface of the crystals to be contoured had first been blackened with ink, and lapping was stopped once the black areas were lapped away. Since a transparent lapping tool, 17, in this example made of transparent ceramic or silica, was used, the gradual size reduction of the black areas could be continuously observed during contouring through the polished backside, 20, of the lapping tool.

Subsequent to the contouring, the individual plates are typically frequency tested, sorted and chemically etched to remove machining damage and perform a final frequency tuning. Electrodes can then be formed on the major surfaces to complete the device structure.

For this type of contouring, the resulting piezoelectric activity (usually expressed in effective resistance) and the frequency of the crystal are dependent upon the radius of curvature of the contoured surface. In this example, with a radius of curvature of 2.8 inches, the frequency of the final, electroded devices was 4.096 MHz, and the effective resistance values were consistently between 20 and 30 Ω in air over a large temperature range ($-40°$ to $+90°$ C.). The degree of contouring for each plate on the tape was extremely uniform as evidenced by the fact that the frequency after contouring varied typically no more than 60 kHz among all plates on one tape. If, for some applications, this range is too large, a number of contoured plates with identical but lower frequencies than required may be returned as a group to the tape for additional frequency tuning by contouring.

In the event that it is desired to contour only a portion of surface, 13, the time required for contouring can be determined, for example, empirically by measuring the mode spacing between the fundamental and inharmonic modes of a completed crystal plate by means of a spectrum analyzer. (See application of Miller cited previously.)

Although in the above-described example all plates attached to the tape had the same size and therefore the same frequency response, different crystal sizes can be included in a single contouring run as long as the same radius of curvature is desired for each plate. While the needs in the majority of piezoelectric resonators which require contouring can be satisfied with convex contours, a limited number may require concave contours. Concave, spherical or cylindrical contours can be easily achieved by this method by providing the appropriate curved surfaces for tool, 17, and applicator, 15. In addition, the method may even be used with a flat lapping surface, 18, when it is desired to uniformly reduce the thickness of the plates. Furthermore, both major surfaces, 12 and 13, of the plates may be contoured, if desired, by successively applying the method described above to both surfaces.

It should be appreciated that throughout the specification and claims, the terms "abrading," "grinding" and "lapping" have been used as generally understood in the art. That is, grinding involves machining with a fixed abrasive tool, lapping involves machining with a loose abrasive (as in the specific example given above) and abrading is meant to include all types of machining.

Various additional modifications will become apparent to those skilled in the art. All such variations which basically rely on the teachings through which the invention has advanced the art are properly considered within the spirit and scope of the invention.

What is claimed is:

1. A method of fabricating piezoelectric devices which include crystal plates comprising the steps of attaching a plurality of crystal plates to a compliant sheet, molding the sheet to the curved shape of an applicator surface, securing the sheet to said applicator surface which includes a resilient pad formed thereon and abrading the plates against another curved surface by means of the applicator to remove at least a portion of one of the surfaces of each plate.

2. The method according to claim 1 wherein the crystal plates comprise quartz.

3. The method according to claim 1 wherein the said another surface is spherical with a radius of curvature in the range 1.5-20 inches.

4. The method according to claim 1 wherein the compliant sheet comprises polyvinyl chloride with a sticky surface to which the plates are adhered.

5. The method according to claim 1 wherein the resilient pad comprises silicone foam rubber.

6. The method according to claim 1 wherein the fundamental frequency of the plates subsequent to the contouring varies no more than 60 kHz.

7. A method of adjusting the frequency response of quartz crystal plates comprising the steps of:

attaching a plurality of said plates to a compliant sheet comprising polyvinyl chloride;

molding said sheet to conform to the spherical surface of an applicator;

securing the sheet to the applicator, the said applicator including a foam rubber pad on the surface to which the sheet is attached;

abrading the plates against the spherical surface of an abrading tool by inserting the applicator therein and applying pressure to the tool so as to produce convex contours on the surfaces of the plates contacting the surface of the tool, thereby adjusting the fundamental frequency of each plate so that it varies no more than 60 kHz from the other plates.

* * * * *